United States Patent [19]

Wang et al.

[11] Patent Number: 5,226,006
[45] Date of Patent: Jul. 6, 1993

[54] WRITE PROTECTION CIRCUIT FOR USE WITH AN ELECTRICALLY ALTERABLE NON-VOLATILE MEMORY CARD

[75] Inventors: Ping Wang, Saratoga; Ching-Shi Jeng, San Jose, both of Calif.

[73] Assignee: Silicon Storage Technology, Inc., Sunnyvale, Calif.

[21] Appl. No.: 700,515

[22] Filed: May 15, 1991

[51] Int. Cl.⁵ .............................................. G11C 7/00
[52] U.S. Cl. ................................ 365/189.01; 365/195; 365/228
[58] Field of Search ....................... 365/189.01, 189.08, 365/230.06, 190, 195, 52, 228

[56] References Cited

U.S. PATENT DOCUMENTS

| | | | |
|---|---|---|---|
| 4,580,246 | 4/1986 | Sibigtroth | 365/195 X |
| 4,665,506 | 5/1987 | Cline et al. | 365/189.01 |
| 4,796,235 | 1/1989 | Sparks et al. | 365/228 |
| 5,016,219 | 5/1991 | Nolan et al. | 365/195 |
| 5,047,982 | 9/1991 | Smith et al. | 365/195 X |
| 5,119,336 | 6/1992 | Itoh | 365/195 |

FOREIGN PATENT DOCUMENTS 0031925 3/1978 Japan ................................. 365/195

Primary Examiner—Eugene R. LaRoche
Assistant Examiner—Son Dinh
Attorney, Agent, or Firm—Limbach & Limbach

[57] ABSTRACT

In the present invention a write protection circuit capable of being used in a memory card is disclosed. The write protection circuit receives an externally supplied write protect signal and generates a protection signal for use with an associated electrically alterable non-volatile memory. The write protection circuit has two non-volatile storage registers, each storing a single bit. Logic means receives a bit from a first register and passes the externally supplied write protect signal as the internally generated protection signal when the bit is in a "1" state. When the bit is in another state, the signal from the second register is used as the protection signal.

9 Claims, 2 Drawing Sheets

WRITE PROTECTION CIRCUIT FOR USE WITH AN ELECTRICALLY ALTERABLE NON-VOLATILE MEMORY CARD

TECHNICAL FIELD

The present invention relates to a write protection circuit which receives an externally applied write signal and generates a protection signal for use with an electrically alterable non-volatile memory. More particularly, the present invention is for use in a memory card wherein the electrically alterable non-volatile memory resides in a plurality of integrated circuit modules.

BACKGROUND OF THE INVENTION

Write protection schemes to protect the data or information stored in a magnetic media such as a floppy disk has been accomplished heretofore through a "switch" on the media. When the media is placed into a reader, such as a floppy disk drive, the system will check if the "switch" is on or off to determine the protection status of the media. The "switch" is not an electrical switch but is merely an indicator. The position of the indicator reflects the status of the "switch" to the reader. Thus, for example, the reader can employ a light emitting source and sensor to detect the position of the indicator, and hence the status of the switch.

With such a protection scheme, a number of errors can arise. First, the software running on the computer which is connected to the reader may ignore the status of the switch and write to the media in any event and destroy the original contents. Secondly, the light emitting source and sensor within the reader may not function properly to either detect the status or to pass that information which is detected to the computer to which it is connected.

Similar to a magnetic storage media, semiconductor storage media, typically known as memory cards, have been proposed to store data or information. Typically, the semiconductor memory is in the form of electrically alterable non-volatile memory such as EEPROM. A memory card typically comprises a plurality of integrated circuit modules each containing an EEPROM memory array. In the context of being analogous to a magnetic storage media having its "switch" on the media, the memory card also uses a "switch" on the memory card to indicate the write protection status of the memory card.

In one prior art proposal, a Software Data Protection (SDP) scheme envisions a write protection circuit which is integrated with the memory array circuit on a single integrated circuit module. The write protection circuit employs a non-volatile register to store the writability status of the memory array circuit with which the write protection circuit is associated. The contents of the non-volatile register can only be written or re-written by a special sequence of access codes. Since the non-volatile register is "on board" with the memory array circuit with which it is associated, the write protection scheme is "hard wired" with the memory array and may not be tampered with by the software nor is it subject to error by the hardware. Thus, the advantages of such a scheme is that the protection does not depend on external software or hardware and the protection setting is non-volatile. However, the SDP method is effective for only a single memory module at a time. Thus, for a memory card having a plurality of memory modules, the SDP scheme cannot be used effectively.

SUMMARY OF THE INVENTION

Therefore, in accordance with the present invention, a write protection circuit for receiving an externally supplied write signal and for generating a protection signal for use with an electrically alterable non-volatile memory is disclosed. The write protection circuit comprises a first electrically alterable non-volatile storage means for storing a first signal. The protection circuit also has a second electrically alterable non-volatile storage means for storing a second signal. Finally, the write protection circuit comprises logic means for receiving the second signal and for passing the externally supplied write signal as the protection signal when the second signal is in one state and for passing the first signal as the protection signal when the second signal is in another state.

BRIEF DESCRIPTION OF THE DRAWINGS

FIG. 2a is a circuit diagram of the write protection circuit of the present invention.

FIG. 2b is a schematic block level diagram of a memory array in a single integrated circuit module, using the write protection circuit of FIG. 2a.

DETAILED DESCRIPTION OF THE DRAWINGS

Figure 1:
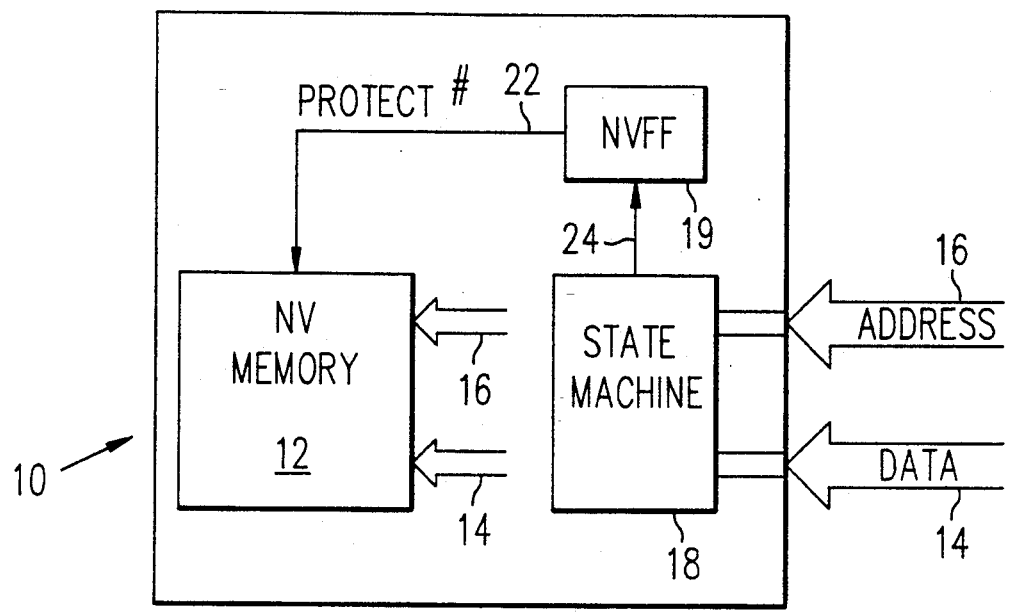
FIG. 1 is a schematic block level diagram of the software data protection apparatus of the prior art associated with a memory array in a single integrated circuit module.

Referring to FIG. 1 there is shown a single integrated circuit module 10 of the prior art. The single integrated circuit module 10 comprises an electrically alterable non-volatile memory 12, such as an EEPROM memory array. The module 10 is adapted to receive a plurality of data lines 14 and a plurality of address lines 16. Within the module 10, the data lines 14 and address lines 16 are supplied to the memory array 12. The integrated circuit module 10 also comprises a state machine 18. The address lines 16 and data lines 14 are also supplied to the state machine 18. Based upon the address lines 16 and data lines 14, the state machine generates an output 24. The output 24 is supplied to a non-volatile flip-flop (NVFF) 19. The output of the NVFF 19 is a protect# signal 22. The protect# signal 22 is supplied to the NV memory array 12 to control the write ability of the memory array 12. The integrated circuit module 10 with its write protection circuit is the Software Data Protection scheme of the prior art.

Figure 2:
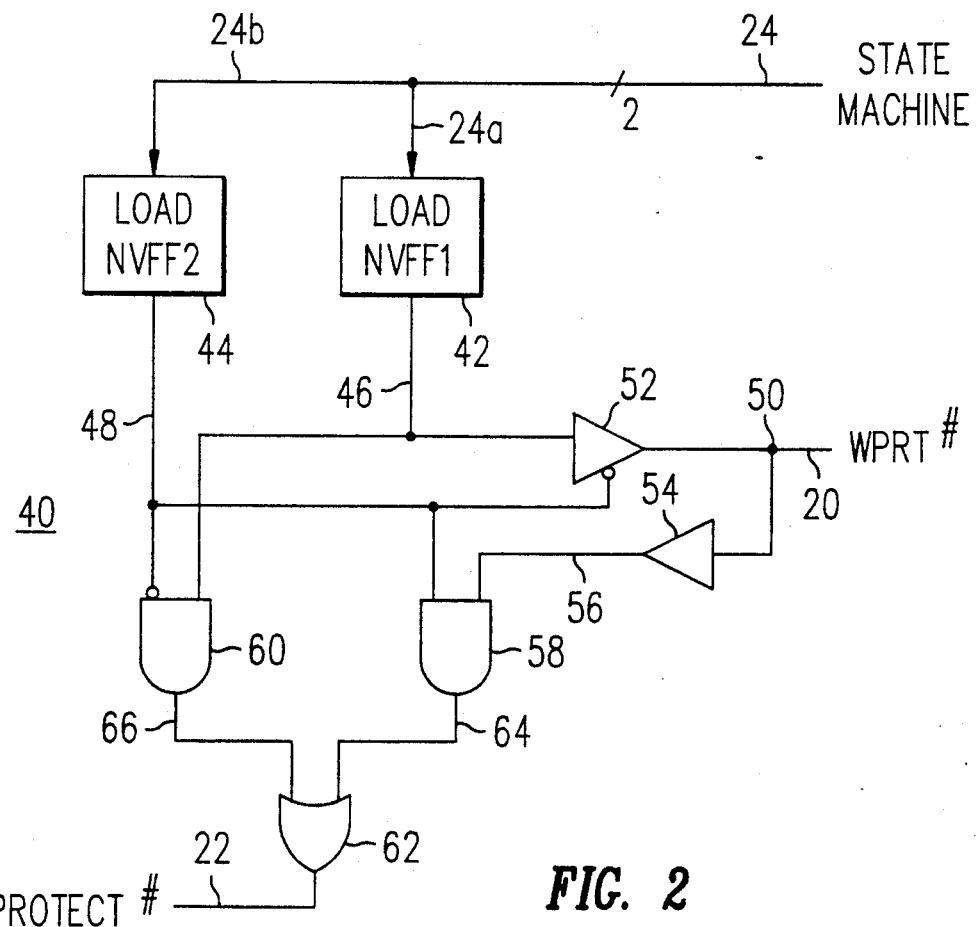

Referring to FIG. 2, there is shown a circuit diagram for a write protection circuit 40 of the present invention. The write protection circuit 40 is used in the integrated circuit module 10 shown in A single integrated circuit module 100 employing the write protection circuit 40 of FIG. 2a is shown in FIG. 2b. The module 100 further comprises an electrically alterable nonvolatile memory 12 and a state machine 18 all as shown and as described in the prior art module 10 shown in FIG. 1.

The write protection circuit 40 of the present invention comprises a first and a second NVFF1 flip-flop 42 and an NVFF2 flip-flop 44. Each of the NVFF1 flip-flop 42 and NVFF2 flip-flop 44 is a non-volatile flip-flop or a non-volatile register whose contents can be electrically altered but is otherwise non-volatile memory. The contents of the NVFF1 register 42 and NVFF2 register 44 is loaded from the state machine 18 along the outputs 24a and 24b, respectively. Each consists of a single bit of information and is stored in the NVFF1 register 42 and NVFF2 register 44. Each of the NVFF1 register 42 and NVFF2 register 44 has as its output a first and a second signal 46 and 48, respectively.

The write protection circuit 40 also comprises an I/O node 50. The I/0 node 50 receives the externally supplied WPRT# signal 20, which is external to the integrated circuit module 10. The write protection circuit 40 also comprises a first buffered amplifier 52 which receives the first signal 46 from the NVFF1 register 42 as its input and supplies as its output to the I/O node 50. The first buffered amplifier 52 is controlled by an inverted second signal 48.

The write protection circuit 40 also comprises a second buffered amplifier 54. The second buffered amplifier 54 receives as its input the signal from the I/O node 50 and generates a third signal 56 as its output. The second signal 48 and third signal 56 are supplied to first AND gate 58 and produces a fourth signal 64. The first signal 46 from the NVFF1 register 42 and the inverted second signal 48 from the NVFF2 register 44 are supplied to a second AND gate 60 producing a fifth signal 66 as is output thereof. The fourth and fifth signal 64 and 66, respectively, are supplied to an OR gate 62, whose output is the protect# signal 22.

In the operation of the write protection circuit 40 of the present invention, NVFF2 register 44 stores the second signal which defines the direction of the signal path at the I/O node 50. Thus, if a "1" is stored in the NVFF2 register 44, then the write protection circuit 40 is in the input mode. If a "0" is stored in the NVFF2 register 44, then the write protection circuit 40 is in the output mode. The first signal which is stored in the NVFF1 register 42 controls the protection status for the non-volatile memory array 12. In the event the first signal 46 is a "1" then the protect# signal 22 is high and the NV memory array 12 is writable. In the event the first signal 46 is "0", then the protect# signal 22 is low and the NV memory array 12 is protected. The operation of the write protection circuit 40 will now be explained as follows:

In the event the second signal 48 is "1", the first buffered amplifier 52 will be off. The externally supplied WPRT# signal 20 will pass through I/O node 50, through the second buffered amplifier 54, and is supplied as the third signal 56. Since the second signal 48 is high, the AND gate 58 will pass the third signal 56 therethrough as the fourth signal 64. Since the inverted second signal is low, second AND gate 60 will be turned off. The OR gate 62 will pass the fourth signal 64 as the output thereof as the protect# signal 22. Thus, when the second signal stored in the NVFF2 register 44 is a "1", then the externally supplied WPRT# signal 20 is passed through the write protection circuit 40 as the protect# signal 22. This occurs irrespective of the condition of the first signal 46.

In the event the second signal 48 is a "0", then first AND gate 58 will be turned off, blocking the externally supplied WPRT# signal 20 from being passed through as the protect# signal 22. The second signal 48 being inverted would be high, enabling the second AND gate 60. Thus, the contents of the NVFF1 register 42 or the first signal 46 would be passed through the second AND gate 60 as the fifth signal 66. With the first AND gate 58 off, the fifth signal 66 would be passed through the OR gate 62 as the protect# signal 22. In this condition, the contents of the NVFF1 register 42 would be supplied as the protect# signal 22.

In addition, when second signal 48 is low, first buffered amplifier 52 would be activated. The contents of the NVFF1 register 42, or the first signal 46, would be passed through the first buffered amplifier 52 supplied to the I/O node 50 and be produced as an output WPRT# signal 20. Thus, when the NVFF2 register 44 is a "0", the contents of the NVFF1 register 42 is supplied as the internal protect# signal 22 and is also generated as an external write signal WPRT# 20 supplied external to the integrated circuit module 10.

Since protect# signal 22 is an active low signal, the NV memory array 12 is write protected when protect# signal 22 goes low. Thus, data cannot be written into the NV memory array 12 when protect# signal 22 is low. If protect# signal 22 is high, then NV memory array 12 may be writable.

As can be seen from the foregoing, the write protection circuit 40 of the present invention has many advantages. The write protection circuit 40 of the present invention has great utility in a memory card application where a plurality of integrated circuit modules 10 are used.

Figure 3:
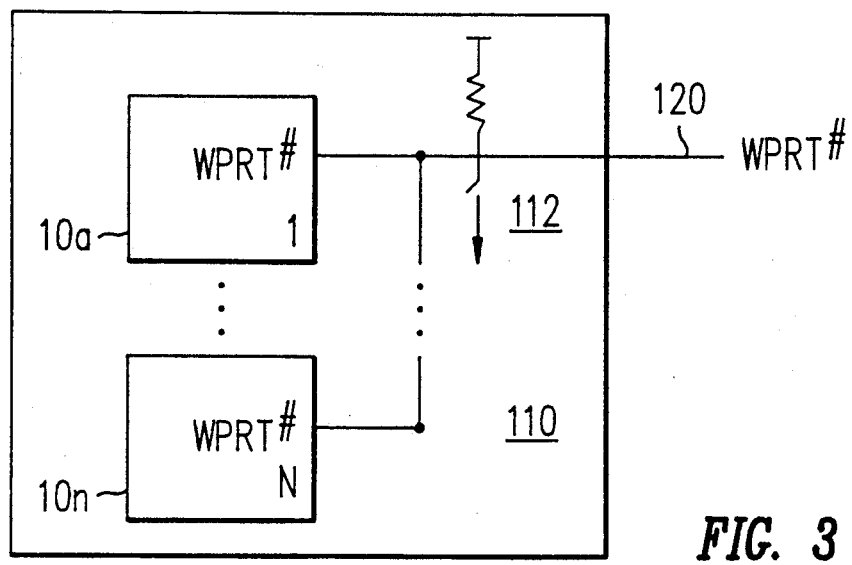
FIG. 3 is a schematic block level diagram of a memory card comprising a plurality of integrated circuit modules, each having an electrically alterable non-volatile memory and a write protection circuit of the present invention associated therewith interconnected in tandem to achieve write protection for the entire memory card based upon an externally supplied write protect signal.

Referring to FIG. 3, there is shown a memory card module 110 with a plurality of integrated circuit modules 100(a . . . n), each having the write protection circuit 40 of the present invention. The WPRT# signal 20 external to each of the integrated circuit modules 100a . . . 100n are connected together. While the WPRT# signal 20 are all external to the integrated circuit modules 100(a . . . n), they are not external to the memory card 110. A WPRT# signal 120, external to the memory card 110, is supplied to the memory card 110. The WPRT# signal 120 is supplied first through a switch 112. From the switch 112, the WPRT# signal 120 is connected to the WPRT# signal 20 which is external to each of the integrated circuit modules 100 (a . . . n).

In the operation of the memory card 110, the NVFF2 register 44 of each of the integrated circuit modules 100 (a . . . n) would be all set to a "1" state. Thus, the externally supplied WPRT# signal 120 would be passed through as the protect# signal 22 of each of the integrated circuit modules 100 (a . . . n). In the event all of the integrated circuit modules 100 (a . . . n) of the memory card 110 is to be memory protected, the switch 112 is activated bringing WPRT# signal 120 to a low state.

This then propagates through all of the integrated circuit modules 100 (*a* . . . *n*) generating the protect# signal 22 as a low signal. With the switch 112 in the open position, all of the integrated circuit modules 100 (*a* . . . *n*) of the memory card 110 would be writable.

Figure 4:
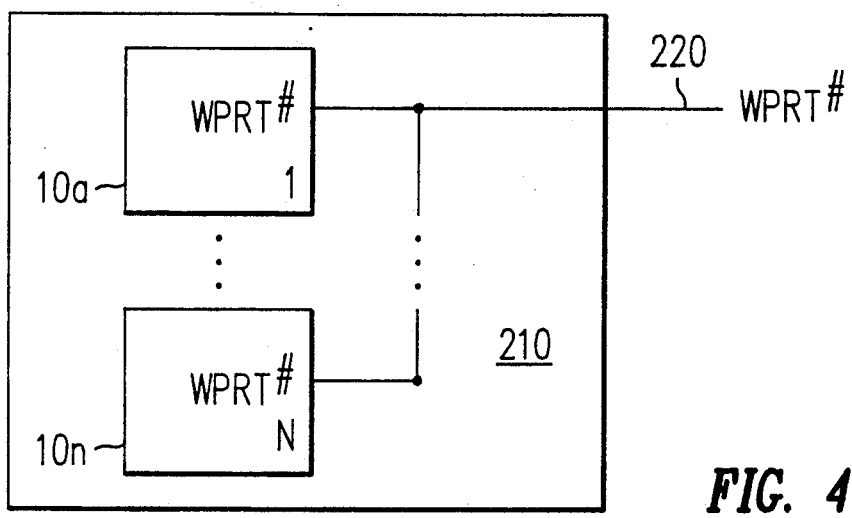
FIG. 4 is a schematic block level diagram of a memory card comprising a plurality of integrated circuit modules each having an electrically alterable non-volatile memory and a write protection circuit of the present invention associated therewith, connected in tandem such that one of said write protection circuit controls the state of write protection for all of the integrated circuit modules in the memory card.

Referring to FIG. 4, there is shown another embodiment of a memory card 210 using a plurality of integrated circuit modules 100 (*a* . . . *n*), each employing the write protection circuit 40 of the present invention. In the embodiment shown in FIG. 4, all of the WPRT# signal 220, supplied to each of the integrated circuit modules 100 (*a* . . . *n*), are connected together. One of the integrated circuit modules 100, e.g., 100*a*, is chosen to be the master. The NVFF2 register 44 of each of the other integrated circuit modules 100 (*b* . . . *n*) is set to the state of "1". Thus, the WPRT# signal 220 supplied to the integrated circuit modules 100 (*b* . . . *n*) would control the protect# signal 22 generated internal thereof. The master integrated circuit module 100*a* would have its NVFF2 register 44 set to "0". Then from the discussion above, the contents of the NVFF1 register 42 of the master integrated circuit module 100*a*, would generate the WPRT# signal 220 which is supplied to the other integrated circuit modules 100(*b* . . . *n*). In addition, the WPRT# signal 220 from the master module 100*a* would be supplied external to the card 210 to inform other components, such as a processor, or the write status of the card 210. In this manner, a single write protection circuit 40 in one of the integrated circuit modules 10*a* controls the write protection status of the entire memory card 210.

Figure 5:
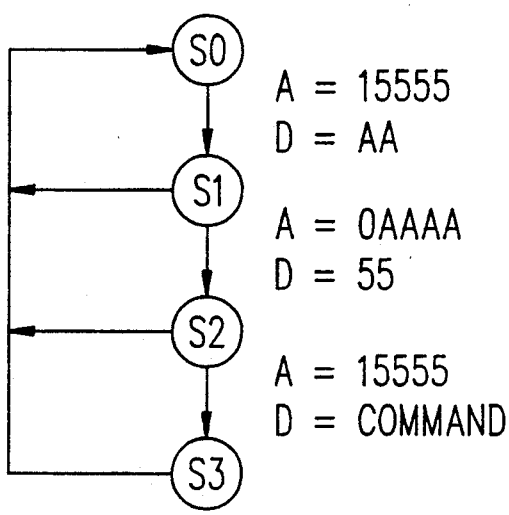
FIG. 5 is a state machine diagram of an example of the commands and signals required to program the write protection circuit of the present invention.

Referring to FIG. 5, there is shown a state diagram showing the loading of the contents of the NVFF1 register 42 and NVFF2 register 44. As previously discussed with reference to FIG. 1, such a state machine 18 and the operation thereof is well known in the art. In fact, the JEDEC (Joint Electron Devices Engineering Council) has established the protocol standard for the state machine 18 to load the contents of the non-volatile protection register used in an EEPROM.

Before any write operation, the integrated circuit module 100 is always at the state S0. Subsequently, no matter which state the integrated circuit module 100 is at, if no write pulse is detected within a pre-specified time period, the integrated circuit module 100 automatically reverts back to state S0.

If a write pulse is detected to write data consisting of "AA" (hexadecimal) into the address location "1555" (hexadecimal), the integrated circuit module 100 enters into state S1. In the event a second write pulse is detected writing data "55" into address "0AAAA", the integrated circuit module 100 enters into state S2. A third write pulse into the address "15555" with the data being the command would cause the command to be written into the various NVFF registers in the integrated circuit module 100. For example, to load NVFF2 to register 44 to "1", the data would be set at "40". To load NVFF2 to register 44 to content of "0", the data would be set at "B0". To load the contents of NVFF1 register 42 to "1", the data would be set at "C0". Finally, to load the contents of NVFF1 register 42 to a "0", the data would be set at "30".

After the loading of the three correct byte sequences, no real write cycle is applied to the memory array 12. Only NVFF1 register 42 or the NVFF2 register 44 is accessed. Any wrong sequence after state S1 causes an abort to revert back to the state S0. Other coding sequences can also be used to access NVFF1 and NVFF2.

The SDP scheme is cited herein only for illustration purpose.

As can be seen from the foregoing, there are many advantages to the apparatus of the present invention. First, the apparatus can be easily implemented into the existing or new systems. Secondly, with the write protection circuit 40 of the present invention, a plurality of the integrated circuit modules, each containing a write protection circuit 40, can be "chained" together to form a memory card, such that the write protection can extend to an entire memory card.

What is claimed is:

1. A memory card comprising:
a plurality of electrically alterable non-volatile memory;
a write protection circuit associated with each of said memory, said circuit for receiving an externally supplied write protect signal and for generating a protection signal for use with the associated memory, said write protection circuit comprising:
a first electrically alterable non-volatile storage means for storing a first signal;
a second electrically alterable non-volatile storage means for storing a second signal;
logic means for receiving said first and second signals and for passing said externally supplied write protect signal as said protection signal when said second signal is in one state; and for passing said first signal as said protection signal when said second signal is in another state; and
means for controlling the write protection of said plurality of memories by one of said protection circuits.

2. The circuit of claim 1 wherein said logic means further generates said first signal as an output write protect signal when said second signal is in another state.

3. The circuit of claim 2 further comprising an I/O node for receiving said externally supplied write protect signal and for providing said output write protect signal.

4. The circuit of claim 3 wherein said logic means further comprising:
a first amplifier means for receiving said first signal and for providing said output write protect signal to said I/O node; said amplifier means controlled by said second signal;
a second amplifier means for receiving said externally supplied write protect signal from said I/O node, and for providing a third signal;
gate means for receiving said first, second and third signals, and for generating said protection signal in response thereto.

5. The circuit of claim 4 wherein said gate means further comprising:
a first logic gate for receiving said second signal and said first signal and for generating a fourth signal in response thereto said fourth signal being the logical AND of said first signal and said second signal inverted;
a second AND gate for receiving said second signal and said third signal and for generating a fifth signal in response thereto; and
an OR gate for receiving said fourth and fifth signals and for generating said protection signal in response thereto.

6. The circuit of claim 1 wherein said circuit and said memory are in a single integrated circuit module.

7. The memory card of claim 1 for receiving a card write protect signal external to said memory card.

8. The memory card of claim 7 wherein said external write protect signals of said plurality of memories are connected in tandem and said card write protect signal is applied to said one protection circuit.

9. The memory card of claim 7 wherein said one of said protection circuits generates a write protect signal, supplied external to said memory card.

* * * * *